United States Patent [19]

Ruque

[11] Patent Number: 5,721,671
[45] Date of Patent: Feb. 24, 1998

[54] SUBRACK FOR ELECTRONIC CIRCUIT BOARDS AND ITS SUPPORT

[75] Inventor: Christian Ruque, Corbas, France

[73] Assignee: Gec Alsthom Transport SA, Paris, France

[21] Appl. No.: 547,134

[22] Filed: Oct. 24, 1995

[30] Foreign Application Priority Data

Oct. 27, 1994 [FR] France .................. 94 12881

[51] Int. Cl.⁶ .................................................. H05K 7/14
[52] U.S. Cl. .................. 361/796; 361/742; 361/788; 361/790; 361/802; 361/825
[58] Field of Search ........................ 361/742, 785, 361/788, 790, 796, 803, 804, 820, 825, 802; 174/261, 267; 439/74, 75

[56] References Cited

U.S. PATENT DOCUMENTS

| Re. 26,837 | 3/1970 | Evans | 361/803 |
| 3,602,774 | 8/1971 | Grant et al. | 361/796 |
| 4,488,354 | 12/1984 | Chan et al. | 361/796 |
| 5,040,992 | 8/1991 | Miyamoto et al. | 361/796 |
| 5,259,784 | 11/1993 | Iwatare et al. | 361/788 |

FOREIGN PATENT DOCUMENTS

| 0213205A1 | 3/1987 | European Pat. Off. | |
| 8910752 U | 12/1989 | Germany | |
| 4133170 A | 4/1993 | Germany | 361/742 |

Primary Examiner—Gerald P. Tolin
Assistant Examiner—John B. Vigushin
Attorney, Agent, or Firm—Sughrue, Mion, Zinn, Macpeak & Seas, PLLC

[57] ABSTRACT

In a subrack, electronic circuit boards are connected to mother boards disposed in at least two planes parallel to the front face of the subrack. Each plane contains one or more mother boards. The planes are superposed to form a stack of compartments the general exterior envelope of which is generally pyramid shaped.

16 Claims, 7 Drawing Sheets

SUBRACK FOR ELECTRONIC CIRCUIT BOARDS AND ITS SUPPORT

BACKGROUND OF THE INVENTION

1. Field of the Invention

The present invention concerns electronic circuit board support assemblies in general and in particular a subrack for electronic circuit boards that plugs in and unplugs automatically and its support.

2. Description of the Prior Art

In the electronic circuit board subrack known as the "Eurofer" subrack, the electronic circuit boards are disposed perpendicularly to the front face of the subrack.

These electronic circuit boards have backplane connectors at their rear ends.

These electronic circuit boards are mounted in the subrack in slideways in which they slide with clearance until they plug into board connectors disposed face-to-face in the subrack.

A rigid clearance allowing fitting of the electronic circuit boards to the connectors is provided by slideways on the board.

Output connectors are fixed to the subrack structure, facing the backplane connectors.

The output connectors are male connectors provided with centering pegs and are mounted to float on the subrack structure by means of spacers with play.

The output connectors are distributed on the rear face of the subrack.

The "Eurofer" subrack can be manipulated by means of two handles on its front face and also has two guide slideways on its sides.

To enable the subrack to be unplugged, an intermediate structure is required in the structure of its case allowing:

floating support of female connectors facing the male output connectors, and provision of means at the sides to enable the guide slideways to engage with the subrack.

Moreover, wired connections of the subrack extend away from the female output connectors disposed on the case structure.

To mount the subrack it is necessary to:

offer up the subrack in line with the guide slideways on the case, and slide the subrack in the guide slideways until abutment at the front of the subrack.

The plugging in of the male and female output connectors disposed on the subrack and in the case relies on centering of each connector and functional clearances. The connectors are centered automatically by the centering pegs and the spacers.

The subrack is fixed to its structure by means of four or eight screws at the front of the subrack.

Other drawbacks of the "Eurofer" subrack include:

its cost is high because it requires costly output connectors and because of the large number of connectors, the large amount of wiring by individual wires and the increased number of connector pins, a substantial depth of the subrack is plugged into the wiring of the case because of the large volume of the connectors, the substantial depth of the subrack because of the two stages of floating connectors, an intermediate wiring area and a circuit board installation area are required and because of the disposition of the output connectors and the disposition of the output wiring, the subrack is difficult to mount because it is heavy and deep, because of the position of its center of gravity and because of its disposition in that, to slide the subrack in, it is necessary to stand in front of it, in which position the slideways cannot be seen, it is virtually impossible to repair or modify the output wiring from the front face of the subrack because of the position of the output connectors and because the case wiring is at the rear of the connectors and at a great distance from the front face of the subrack, so that it is necessary to provide other access areas or to demount the structure from the case, the subrack is unplugged manually by pulling with sufficient force on two handles provided at the front of the subrack, this force being increased by virtue of the increased number of output connectors, failure to comply with standards on vibration, impact and electromagnetic interference, which standards are becoming more and more severe.

Accordingly, one object of the invention is a subrack for electronic circuit boards that plugs in and unplugs automatically and that is free of the disadvantages of the prior art support assemblies.

The application has designed a subrack for electronic circuit boards that plugs in and unplugs automatically and which shortens the installation time and eliminates the problems of connection, reliability, wiring and access to external connections.

SUMMARY OF THE INVENTION

The invention consists in a subrack for electronic circuit boards adapted to be inserted into a support for the subrack, said electronic circuit boards being connected to mother boards, said mother boards being disposed in at least two planes, characterized in that said subrack plugs in and unplugs automatically and in that said mother boards are parallel to the front face of said subrack.

The subrack and its subrack support also have at least one of the following features:

said subrack support has a general interior shape similar to the general exterior envelope of said subrack, output connectors are fixed to said support of the subrack, connectors of said subrack being adapted to connect automatically to said output connectors.

The subrack of the invention has at least one of the following features:

each plane contains one or more mother boards, said mother boards and their electronic circuit boards being superposed to form a stack of compartments the general exterior envelope of which is generally pyramid shaped, the front face of the subrack faces the mother board or the set of coplanar mother boards having the largest surface area, male output connectors are fixed to the ends of said mother boards, the compartments of the subrack include stiffener plates for the mother boards and/or protective plates for the electronic circuit boards, at least one mother board of a compartment $n$ is omitted to allow provision of four rows of connectors on the mother board of the next compartment $n+1$, at least one mother board of a compartment n is offset to align it with one side of the previous compartment n−1 or the next compartment n+1 so that the connectors of said mother board of said compartment n can be disposed on one side of the subrack, the compartments are all aligned with one side of the subrack so that all of the connectors can be on one side of the subrack, at least one compartment contains only one mother board, at least one compartment contains two mother half-boards, at least one compartment contains four mother quarter-boards, at least one compartment contains one mother half-board and two mother quarter-boards, the areas of the mother board and the sets of coplanar mother boards have increasing values according to their position in said pyramid shaped stack, the mother board or the set of mother boards nearest the front face of the subrack having the greatest area, the mother boards are disposed in planes parallel to the front face of the subrack by means of spacers fastened to said stiffener plates of the mother boards and/or said protective plates of the daughter electronic circuit boards.

The advantages of the subrack for electronic circuit boards that plugs in and unplugs automatically include:

it eliminates much of the wiring of the backplane with individual wires, whilst retaining automatic unplugging, the volume and in particular the depth of the subrack and its support are greatly reduced because of the use and the positioning of the mother boards substituted for the standardized boards of the prior art, the elimination of the wiring of the backplane with its two rows of connectors, and the relocation of the output wiring area from the rear of the subrack to the sides; all these advantages facilitate installation in the case, the volume and the depth of the subrack are exactly matched to the intended function; by juxtaposing levels, the subrack best suited to the intended function is produced, with one, two or three compartments, which is impossible with the prior art devices, it adapts readily to the functional requirement in terms of output wiring through the choice of the number of connectors per compartment, the various choices of circuit board format for each compartment and different positioning of the mother boards in each compartment, it protects the electronic circuit boards against vibration and impact because these are transferred mechanically to sheet metal panels through screws at various points.

Other objects, features and advantages of the invention will emerge from a reading of the description of the preferred embodiment of the subrack for electronic circuit boards that plugs in and unplugs automatically given with reference to the appended drawings.

DETAILED DESCRIPTION OF THE PREFERRED EMBODIMENTS

In a subrack 1 for electronic circuit boards 2 adapted to be mounted in a support 11 for the subrack 1, the electronic circuit boards 2 are connected to mother boards 3A–3C disposed in at least two planes.

In the subrack and its support of the invention the subrack plugs in and unplugs automatically and the mother boards 3A–3C are parallel to the front face 6 of the subrack 1.

The general interior shape of the subrack support is similar to the general exterior envelope of said subrack 1.

Output connectors 4A–4C are preferably fixed to the support 11 of the subrack 1, connectors 5A–5C on the subrack 1 being adapted to connect automatically to said output connectors 4A–4C.

Figure 1:
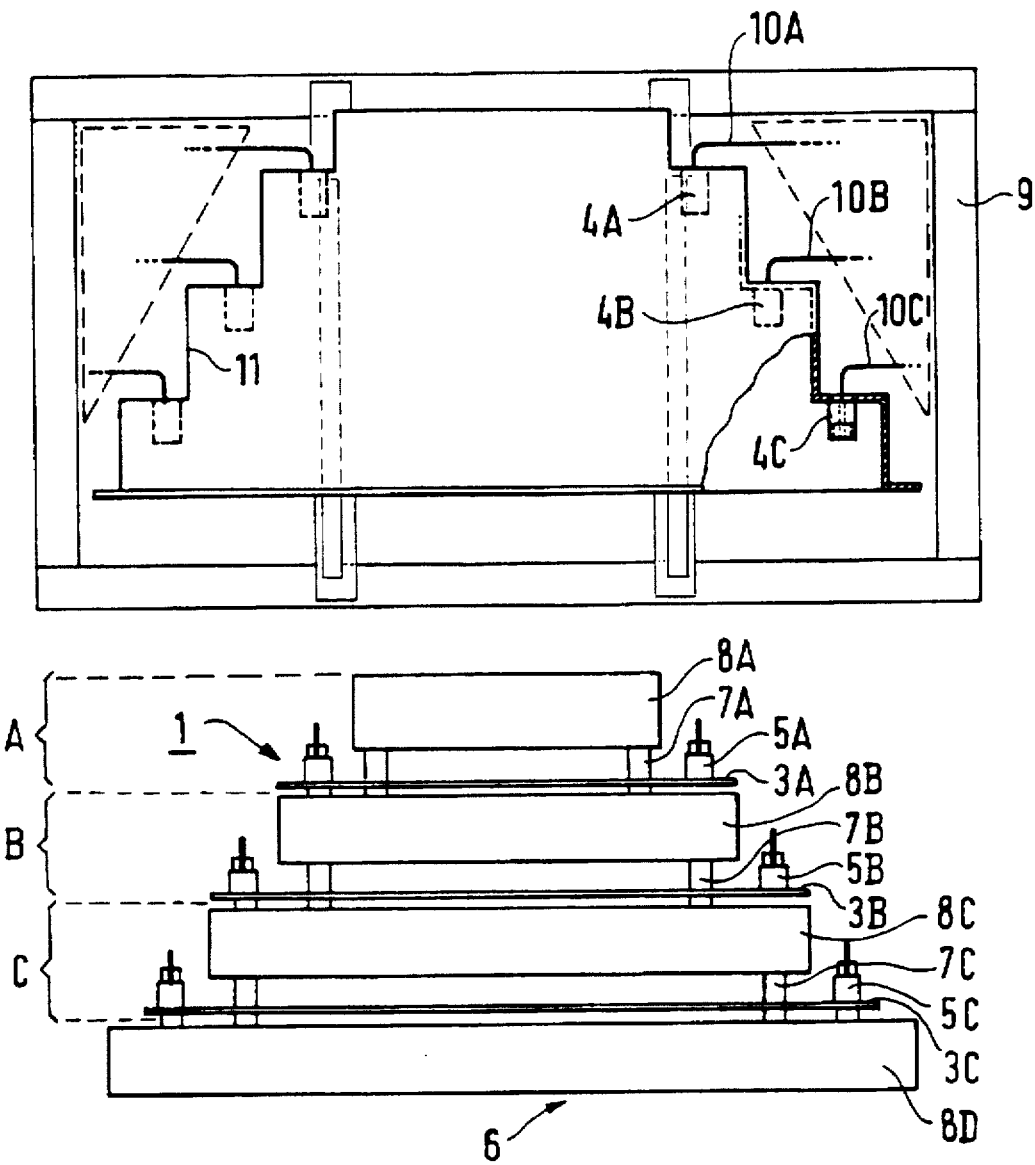
FIG. 1 is a part-sectional top view of a three-stage subrack for electronic circuit boards that plugs in and unplugs automatically and its case, both in accordance with one preferred embodiment of the invention.
Figure 2:
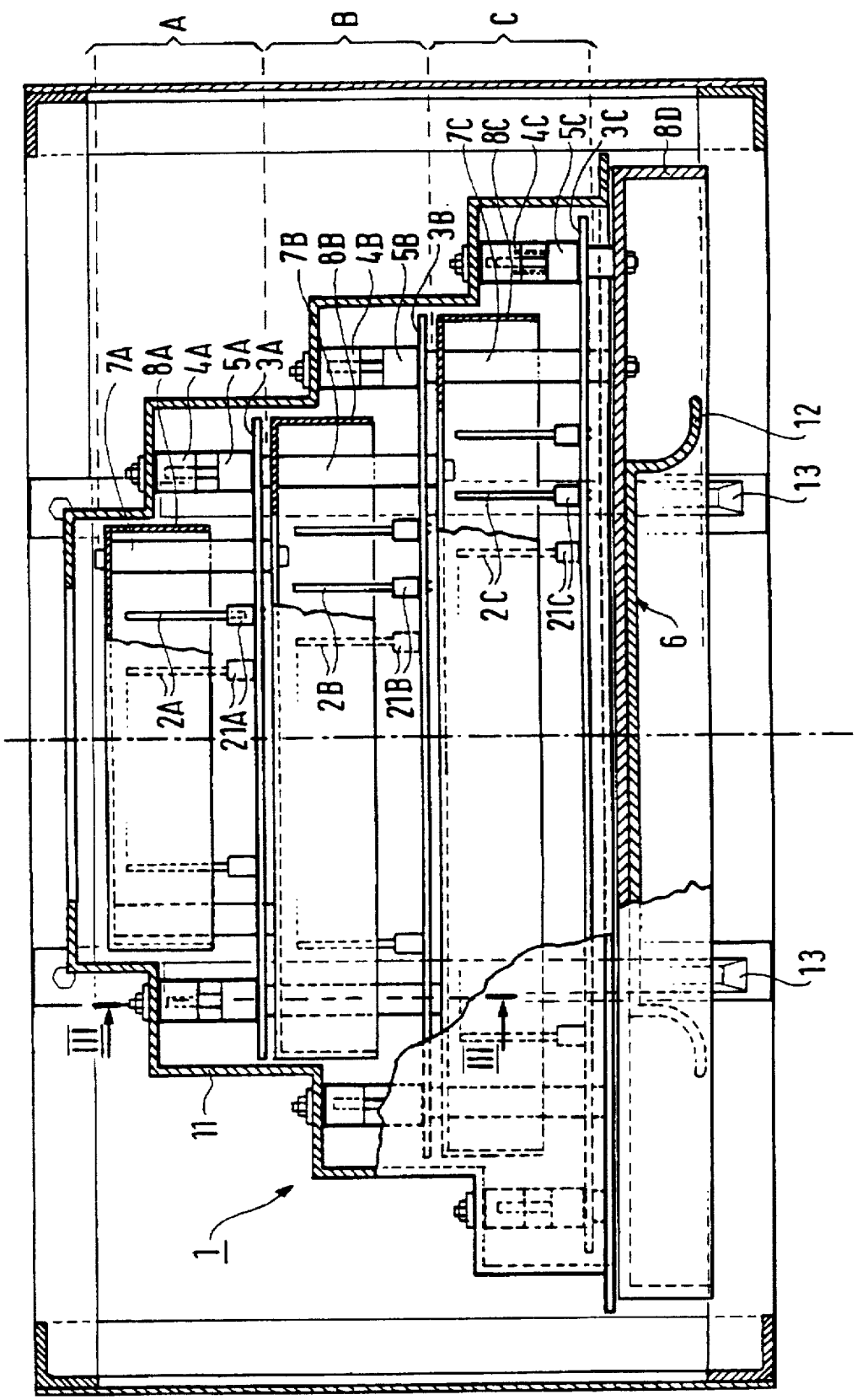
FIG. 2 is a part-sectional top view of the preferred embodiment of the subrack and its case with the subrack inserted into the case.

FIGS. 1 and 2 are two part-sectional top views of a preferred embodiment of a three-stage subrack for electronic circuit boards that plugs in and unplugs automatically and its case, both in accordance with the invention.

In this preferred embodiment of the invention the subrack 1 for electronic circuit boards 2A–2C includes daughter electronic circuit boards 2A–2C connected to mother boards 3A–3C.

The electronic circuit boards 2A–2C are connected to the mother boards by means of board connectors 21A–21C.

The mother boards 3A–3C are disposed in at least two planes parallel to the front face 6 of the subrack 1, each plane containing one or more mother boards.

The planes are superposed to form a stack in the shape of a pyramid.

The front face 6 of the subrack 1 faces the largest surface area mother board or set of coplanar mother boards.

The subrack 1 for electronic circuit boards 2A–2C therefore includes large mother boards 3A–3C to the shorter sides of which male output connectors 5A–5C are fixed.

The male output connectors 5A–5C can be connected automatically to the female connectors 4A–4C. The female output connectors 4A–4C terminate the output wiring 10A–10C.

Each design of mother board has one or more male output connectors 5A–5C.

The set of mother boards is disposed parallel to the plane of the front face 6 of the subrack 1 to form a stack of mother board compartments A–C.

The mother boards have different widths depending on their compartment.

The set of mother boards is disposed and held to form a stack in the shape of a pyramid.

By "stack in the shape of a pyramid" is meant a stack of mother boards such that the imaginary exterior envelope defined by the set of mother boards comprises a set of steps along the longitudinal axis and/or along the radial axis to form a podium along one or both axes.

As previously stated, the front face 6 of the subrack 1 faces the larger surface area mother board or set of coplanar mother boards.

The construction of the subrack in accordance with the invention for electronic circuit boards necessitates fixing of the various mother boards together by means of spacers 7A–7C.

These spacers 7A–7C are preferably attached to plates which act as stiffener plates 8B–8D for the mother boards 3A–3C and/or protective plates 8A–8C for the daughter electronic circuit boards 2A–2C.

The electronic circuit board subrack also has holding means 12 attached to the front face 6 of the subrack 1.

These holding means 12 are handles or openings respectively fixed to or formed in the front face 6 of the subrack 1, for example.

The subrack for electronic circuit boards includes a support 11 for the subrack 1 to facilitate mounting it in a case 9. Mounting the subrack 1 in the case 9 is all the easier in that the subrack is shallow and therefore has a center of gravity near the front face.

The subrack for electronic circuit boards that plugs in and unplugs automatically can be inserted into the support 11 by means of slideways 13 attached to the bottom face of the support 11 and extending from the front of the support to the rear of the support.

The support 11 for the subrack 1 has the following functions:

- it provides a rough and ready rest for the subrack when the latter is first offered up, by means of a projection at the front and at the bottom of the support,
- it allows perfect centering and plugging in, without the operative being able to see what he is doing, because inclined faces on the sides of the lower part of the subrack automatically center the subrack throughout its movement into the case,
- four centering pegs prevent offering up of the subrack slantwise to the connectors,
- supports two plastics material slideways and pre-adjustment to within 2 mm for the final plugging in to ensure easy sliding of the subrack in its support,
- it has perforations through which the output wiring cables 10A–10C pass,
- it supports the floating female connectors 4A–4C,
- four screws provide a simple and effective mechanical coupling between the subrack and the case support, complying with the most severe standards in terms of vibration and impact.

The support 11 for the subrack 1 forms a podium the general interior shape of which is similar to the general exterior envelope of the mother boards 3A–3C stacked in accordance with the invention.

Figure 3:
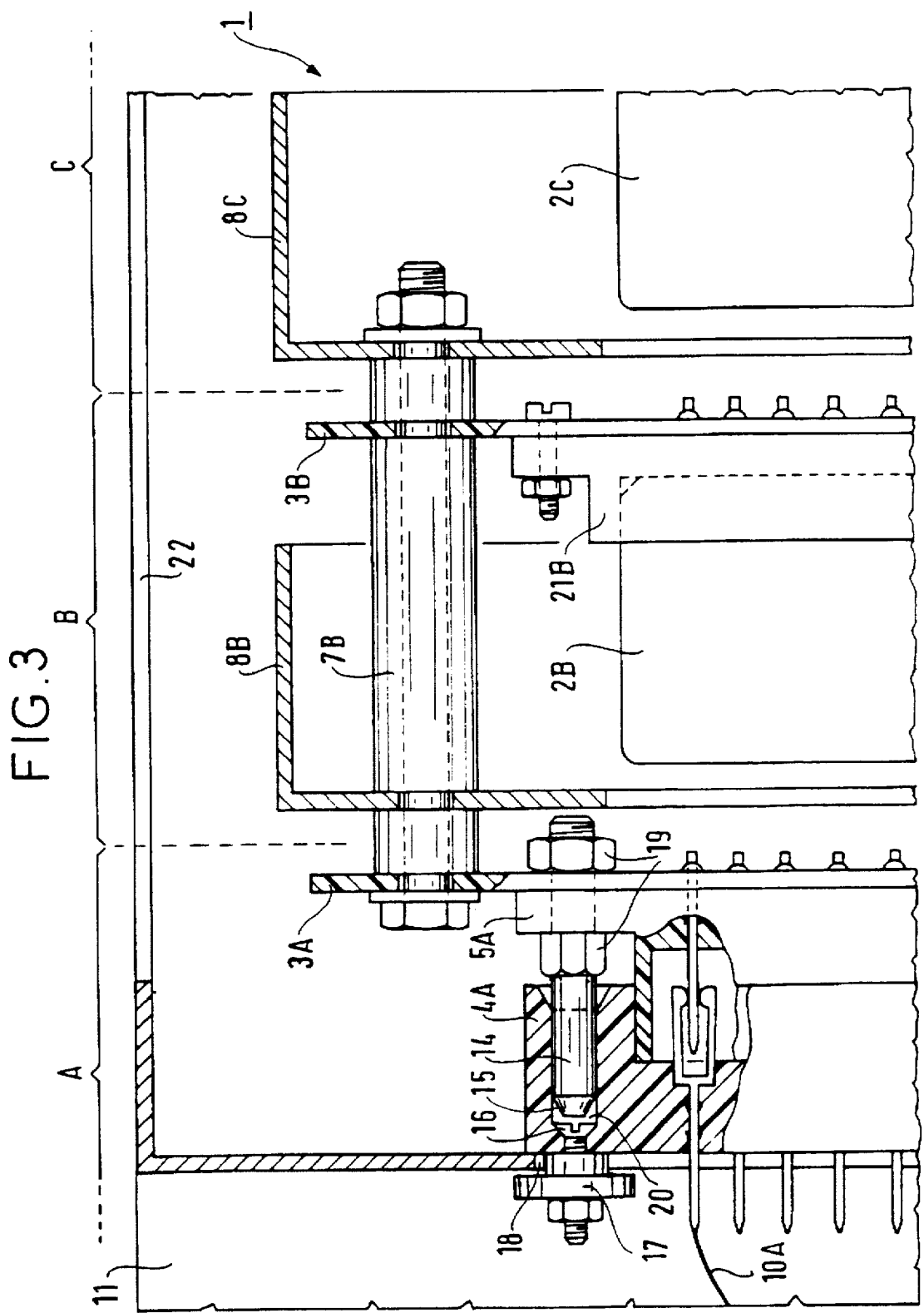
FIG. 3 is a view in section on the line III—III in FIG. 2, the output connectors of the subrack being shown connected.
Figure 4:
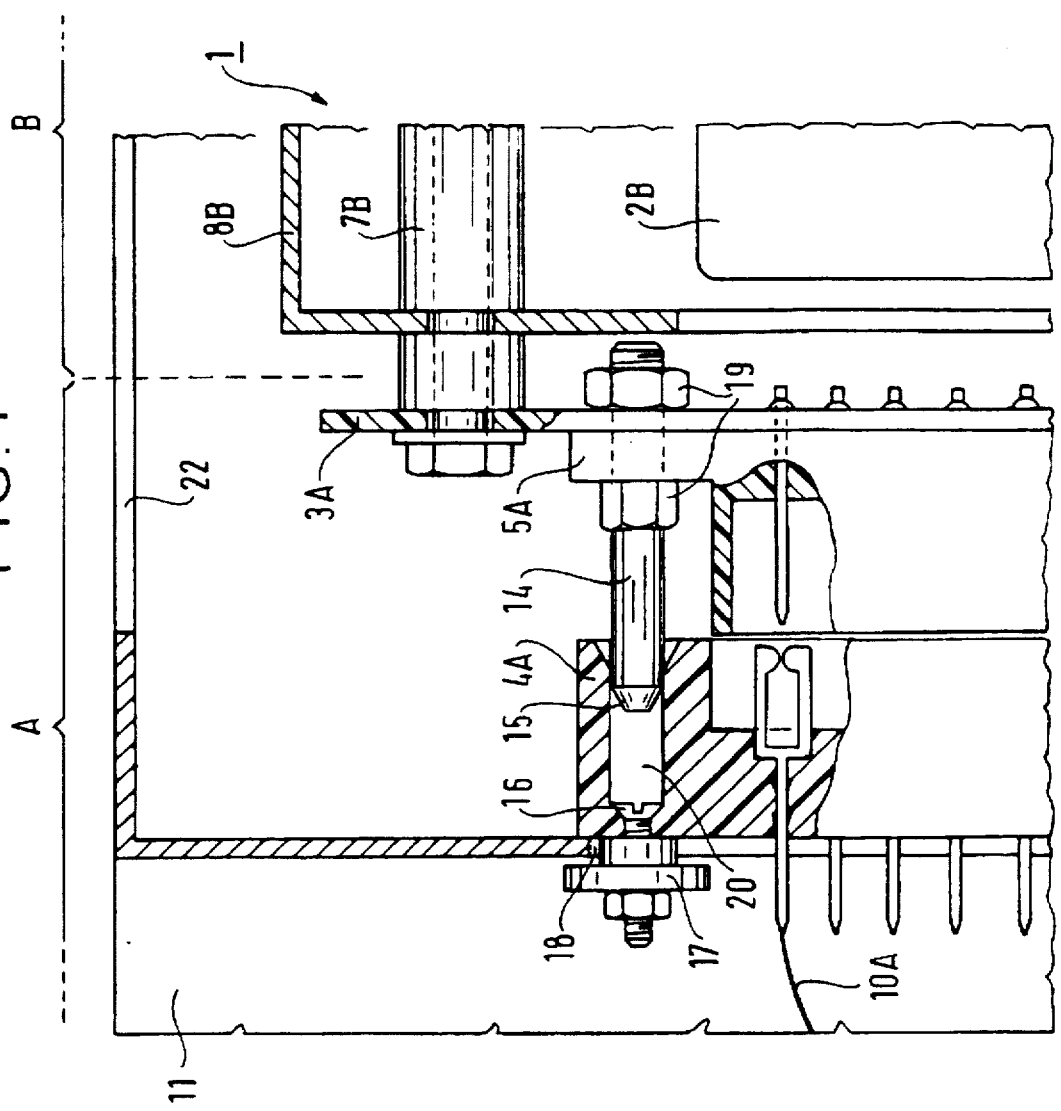
FIG. 4 is a view in section on the line III—III in FIG. 2, the output connectors of the subrack being shown disconnected.

FIGS. 3 and 4 are two views in section on the line III–III in FIG. 2 in which the output connectors 4A, 5A of the subrack are respectively connected and disconnected.

FIGS. 3 and 4 show the subrack 1 and the electronic circuit boards 2B, 2C respectively associated with the second and third compartments B and C, the electronic circuit board 2B being connected to the mother board 3B by means of board connectors 21B.

FIGS. 3 and 4 also show the stiffener plates 8B, 8C respectively associated with the second and third compartments B and C and the spacer 7B associated with the second compartment B.

They also show the female and male connectors 4A and 5A associated with the first compartment A.

The output connectors 4A–4C are fixed to the support 11 of the subrack 1 by fixing means comprising screws 16 and spacers 17 that provide a floating mount.

The floating mount is obtained by means of a play 18 a few tenths of a millimeter deep and approximately 2 mm transversely to the fixing axes, for example.

The electronic circuit board subrack also includes two centering pegs 14 associated with each fixing means for the output connectors 4A–4C.

These pegs preferably have a bevel 15.

The pegs 14 are fixed to the associated mother boards 3A–3C by appropriate means 19 for fixing the male output connectors 5A–5C to the associated mother board 3A–3C.

The coupling of the male output connectors (e.g. 5A) is achieved by penetration of the two pegs into spot facings 20 on the female output connectors (e.g. 4A).

The female output connectors 4A–4C are disposed on each side of the support 11 for the subrack 1 and are offset in each compartment so that they are not coplanar.

Other advantages of the support for the subrack of the invention include:

- it provides access to the output wiring 10A–10C from in front of the case 9 without any demounting, the female output connectors 4A–4C being oriented towards the front of the subrack,
- the integration of the case wiring 10A–10C does not project to either side of the surface area corresponding to the front face 6 of the subrack 1, which minimizes the overall depth of the wiring and enables it to be disposed near the front face of the subrack, facilitating modification of the wiring.

To allow this, the female connectors 4A–4C must be detached and moved far enough forward to obtain access to the wiring 10A–10C.

The feature of the invention that provides a subrack support in the form of a podium has the advantages of providing an effective screen against electromagnetic interference around the subrack because of the presence of solid walls and because of the openings 22 in the upper, lower and bottom parts.

The openings 22 also enable removal of heat.

The openings can be provided either by making holes directly in the top and bottom walls of the subrack support or by attaching perforated plates.

The openings enable distribution terminals (not shown) for the wiring 10A–10C and retaining means for the case wiring and clamps (not shown) for screened cables, to be mounted on the step faces of the support 11 for the subrack 1 in the form of a podium.

Figure 5:
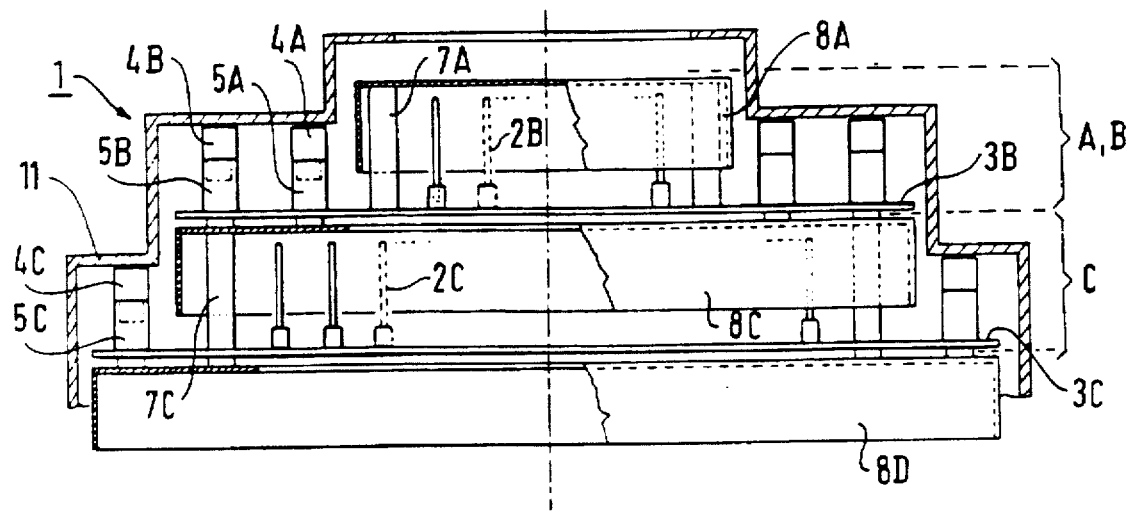
FIG. 5 is a part-sectional top view of the preferred embodiment of a subrack for electronic circuit boards showing one particular arrangement whereby four rows of connectors can be disposed on the mother board of the second compartment.

FIG. 5 is a part-sectional top view of the subrack 1 for electronic circuit boards 2A–2C showing one particular arrangement of the first compartment A and the mother board 3B in the second compartment.

The elimination of the mother board from the first compartment A and of the stiffener/protection plates from the second compartment B enables four rows of connectors 4A, 5A and 4B, 5B to be mounted on the mother board 3B of the second compartment B and, as in the previous embodiment, two rows of connectors 4C, 5C to be mounted on the mother board 3C in the third compartment C.

In this specific embodiment, the fixing spacers 7B of the second compartment B are omitted, leaving only the spacers 7A and 7C of the first and third compartments.

Also retained are the stiffener/protection plate 8C and stiffener plate 8D for the mother boards 3B, 3C and stiffener/ protection plate and the protective plate 8A–8C for the electronic circuit boards 2B and 2C, respectively.

Figure 6:
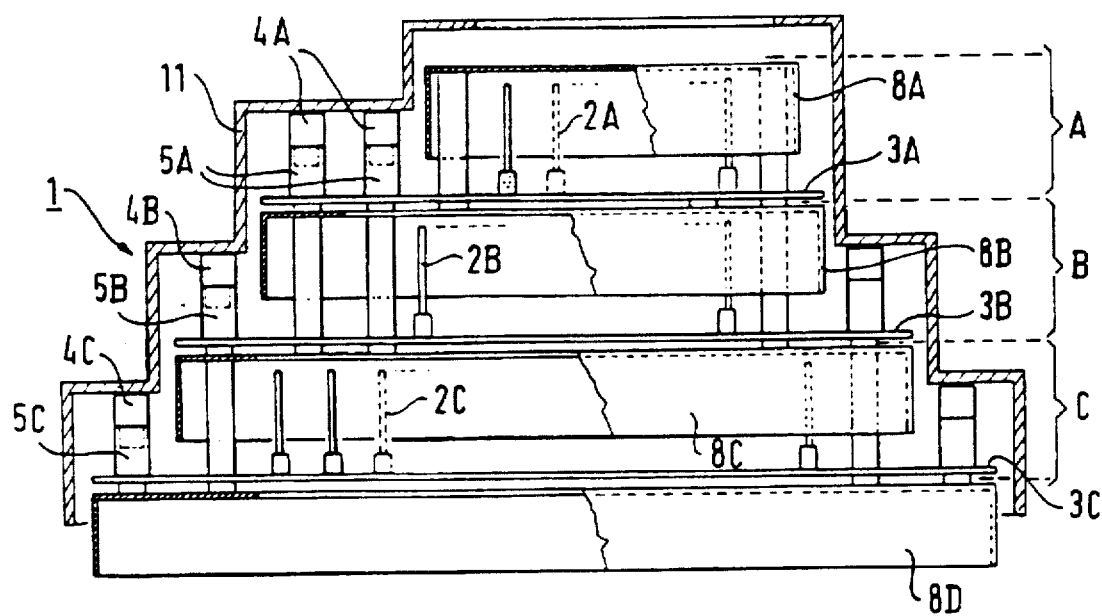
FIG. 6 is a part-sectional top view of the preferred embodiment of the subrack for electronic circuit boards showing one particular arrangement enabling the connectors to be disposed at one side of the subrack.

FIG. 6 is a part-sectional top view of the electronic circuit board subrack 1 showing an arrangement of the first compartment A and the second compartment B allowing all of the connectors 4A, 5A on the mother board 3A in the first compartment A to be disposed on one side of the subrack 1, to be more precise on one side of the mother board 3A of the first compartment A.

In this other embodiment shown in FIG. 6, it is possible to offset one of the compartments n, for example the first compartment A, to align it with one side of the previous compartment n−1 or the next compartment n+1 (the second compartment B in the example shown in FIG. 4).

An arrangement of this kind enables the connectors to be placed at one end of one of the mother boards.

It is equally possible to align more than one compartment, for example the compartments A and B, with another compartment, for example the compartment C, to arrange the compartments in a different way.

Figure 7:
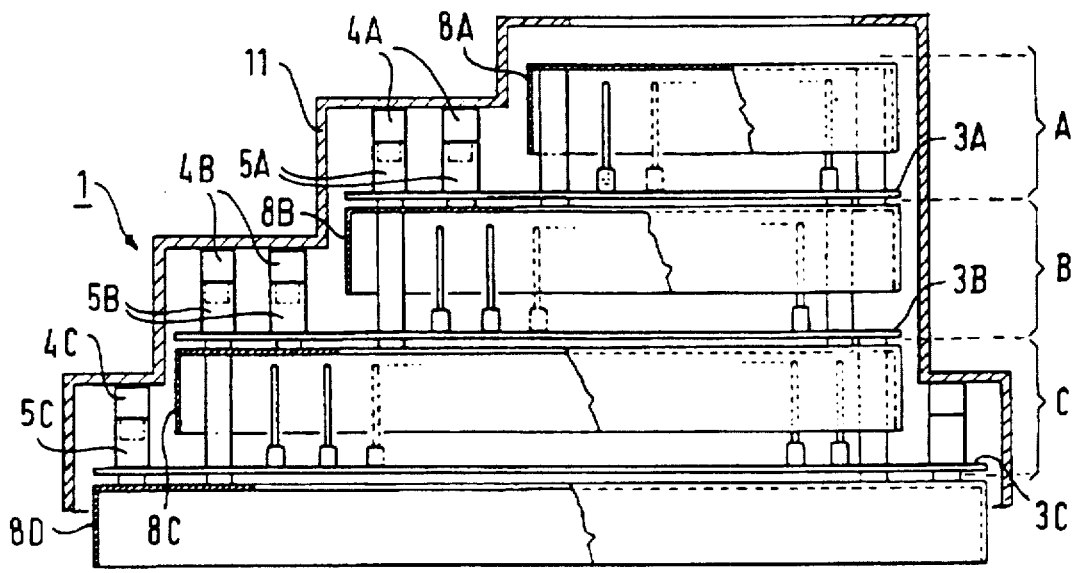
FIGS. 7 and 8 are part-sectional top views of the first embodiment of subrack for electronic circuit boards showing two other particular arrangements.

One such embodiment is shown in FIG. 7.

Figure 8:
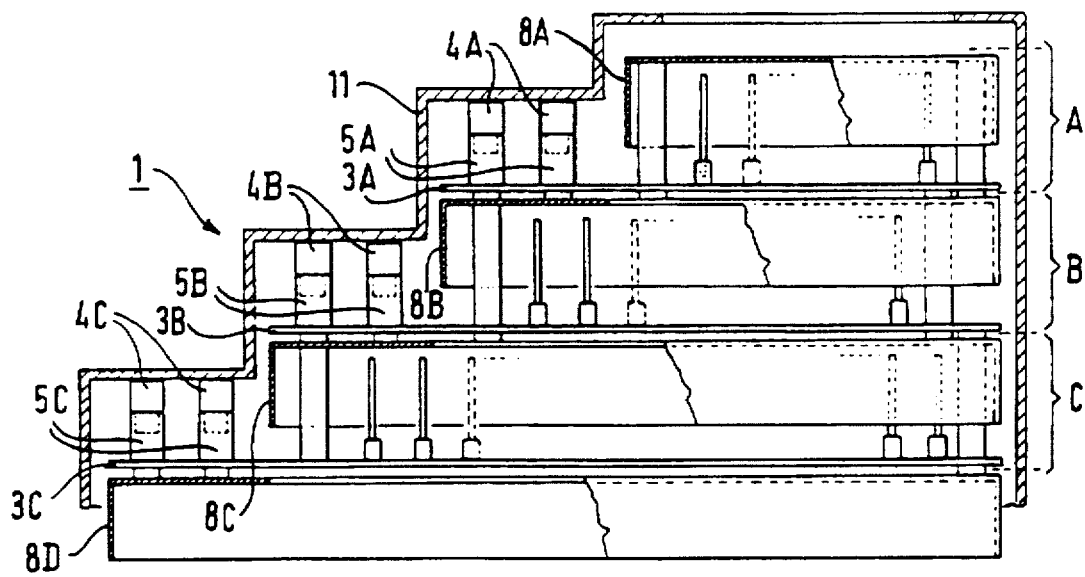

It is also possible to align all of the compartments A–C with one side of the subrack, one such alignment being shown in FIG. 8, for example.

An arrangement of this kind allows all of the connectors to be disposed at one side of the subrack.

In FIGS. 5 through 8 described above, the support 11 for the subrack 1 is still of generally pyramid shape.

However, some of the steps constituting the podium can be eliminated according to the compartments present and their respective alignments.

A large number of different combinations of mother boards can be selected and associated in each compartment.

Figure 9A:
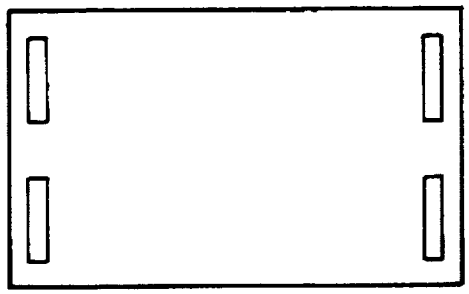
FIGS. 9A through 9F are diagrammatic representations of different combinations of mother boards in each compartment.
Figure 9B:
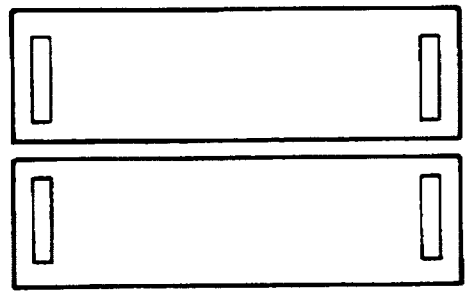
Figure 9C:
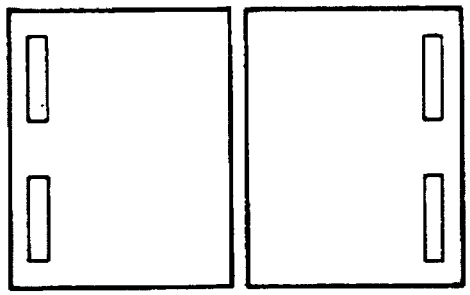
Figure 9D:
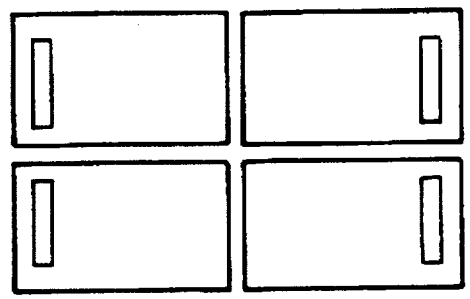
Figure 9E:
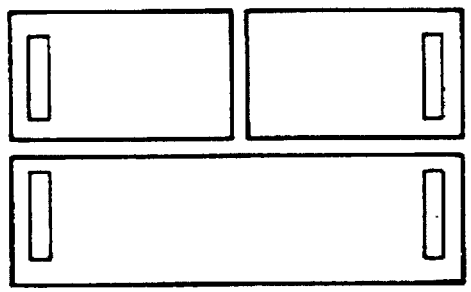
Figure 9F:
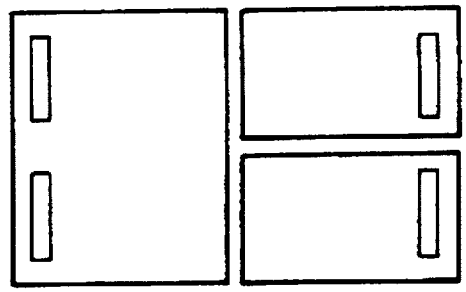

For a subrack comprising six successive compartments, the arrangement of the mother boards in a generally pyramid shape is obtained by selecting mother boards from the following list:

a single mother board (FIG. 9A),
 two mother half-boards disposed horizontally (FIG. 9B),
 two mother half-boards disposed vertically (FIG. 9C),
 four mother quarter-boards (FIG. 9D),
 one mother half-board disposed horizontally associated with two mother quarter-boards also disposed horizontally (FIG. 9E), and
 one mother half-board disposed vertically associated with two mother quarter-boards disposed vertically (FIG. 9F).

It is clear that all the mother boards shown in FIGS. 9A through 9F are the same size but that the areas of the mother boards differ according to their respective compartments.

In other words, the areas of the mother boards and the sets of coplanar mother boards 3A–3C have increasing values according to their position in the pyramid shape stack.

As previously mentioned, the mother board or the set of mother boards nearest the front face of the subrack has the largest area.

With regard to the construction of the electronic circuit board subrack, the output connectors are wave-soldered to the mother boards, for example.

This has the advantage that the output wiring is integrated into the volume defined by the front face of the subrack.

The subrack is fixed to its case by means of a plurality of screws.

There is claimed:

1. A subrack for electronic circuit boards, said subrack having a front face and being adapted to be inserted into a subrack support such that said front face faces outwardly, said subrack including a plurality of mother boards for supporting and connecting to electronic circuit boards, said mother boards being disposed in at least two mother board planes, said subrack characterized in that it electrically plugs into said subrack support automatically upon insertion of said subrack into said subrack support and electrically unplugs automatically upon removal of said subrack from said subrack support, and in that said mother boards are parallel to said front face of said subrack.

2. A subrack assembly comprising a subrack according to claim 1 in combination with said subrack support, wherein said subrack has an exterior envelope shape and said subrack support has a general interior shape similar to said exterior envelope of said subrack.

3. A subrack assembly comprising a subrack according to claim 1 in combination with said subrack support, wherein electrical output connectors are fixed to said subrack support, said subrack having electrical connectors adapted to connect automatically to said output connectors upon insertion of said subrack into said subrack support.

4. A subrack according to claim 1, wherein each mother board plane contains at least one mother board, said mother boards being superposed to form a stack of compartments the general exterior envelope of which is generally pyramid shaped.

5. A subrack according to claim 4 wherein the aggregate areas of the mother boards in each mother board plane have increasing values according to their position in said pyramid shaped stack, the mother board plane nearest the front face of the subrack having the greatest mother board area.

6. A subrack according to claim 1 wherein the mother board or the set of coplanar mother boards having the largest area is closest to the front face of the subrack.

7. A subrack according to claim 1 wherein male output connectors are fixed to ends of said mother boards.

8. A subrack according to claim 1 wherein the compartments of the subrack include at least one of stiffener plates for the mother boards and protective plates for the electronic circuit boards.

9. A subrack according to claim 8 wherein the mother boards are disposed in planes parallel to the front face of the subrack by means of spacers fastened to at least one of said stiffener plates of the mother boards and said protective plates of the electronic circuit boards.

10. A subrack according to claim 1 wherein the number of connectors on the at least one mother board of one compartment is greater than the number of connectors on the at least one mother board in an adjacent compartment on the side of said one compartment away from said front face.

11. A subrack according to claim 1 further comprising a number of electrical connectors on each mother board, wherein at least one mother board disposed in a given mother board plane is offset to align an edge of said one mother board with an edge of an adjacent mother board in a different mother board plane so that the connectors of at least one of said one and adjacent mother boards can be disposed on one side of the subrack.

12. A subrack according to claim 9 wherein all mother boards of the subrack are substantially aligned at one side of the subrack so that all of the connectors can be on one side of the subrack.

13. A subrack according to claim 1 wherein at least one mother board plane contains only one mother board.

14. A subrack according to claim 1 wherein at least one mother board plane contains two mother half-boards.

15. A subrack according to claim 1 wherein at least one mother board plane contains four mother quarter-boards.

16. A subrack according to claim 1 wherein at least one mother board plane contains one mother half-board and two mother quarter-boards.

* * * * *